United States Patent
Patil et al.

(10) Patent No.: US 9,754,903 B2
(45) Date of Patent: Sep. 5, 2017

(54) SEMICONDUCTOR STRUCTURE WITH ANTI-EFUSE DEVICE

(71) Applicant: GLOBALFOUNDRIES Inc., Grand Cayman (KY)

(72) Inventors: Suraj K. Patil, Ballston Lake, NY (US); Min-hwa Chi, Malta, NY (US); Ajey Poovannummoottil Jacob, Watervliet, NY (US)

(73) Assignee: GLOBALFOUNDRIES INC., Grang Cayman (KY)

( * ) Notice: Subject to any disclaimer, the term of this patent is extended or adjusted under 35 U.S.C. 154(b) by 0 days.

(21) Appl. No.: 14/926,880

(22) Filed: Oct. 29, 2015

(65) Prior Publication Data

US 2017/0125361 A1     May 4, 2017

(51) Int. Cl.
    *H01L 21/00*     (2006.01)
    *H01L 23/62*     (2006.01)

(52) U.S. Cl.
    CPC .................................. *H01L 23/62* (2013.01)

(58) Field of Classification Search
    None
    See application file for complete search history.

(56) References Cited

U.S. PATENT DOCUMENTS

| | | | | |
|---|---|---|---|---|
| 4,670,970 A | * | 6/1987 | Bajor | H01L 23/5252 257/E23.147 |
| 4,796,075 A | * | 1/1989 | Whitten | H01L 23/5256 257/665 |
| 5,298,784 A | * | 3/1994 | Gambino | H01L 23/5252 257/529 |
| 5,384,481 A | * | 1/1995 | Holzworth | H01L 21/76888 257/50 |
| 5,482,884 A | * | 1/1996 | McCollum | H01L 23/5252 148/DIG. 55 |
| 5,525,830 A | * | 6/1996 | Chen | H01L 21/76888 257/50 |
| 5,541,441 A | * | 7/1996 | Yeuochung | H01L 23/5252 257/50 |
| 5,573,971 A | * | 11/1996 | Cleeves | H01L 21/76888 257/E21.592 |

(Continued)

OTHER PUBLICATIONS

Sritbaran, et al., "Characteristics of Sputter Coated Copper Films on Silicon Wafer," International Workshop on Surface Engineering and Coatings NAL, Banglalore, India, Jun. 1998.

(Continued)

*Primary Examiner* — Evren Seven
(74) *Attorney, Agent, or Firm* — Wayne F. Reinke, Esq.; Heslin Rothenberg Farley & Mesiti P.C.

(57) ABSTRACT

A semiconductor structure includes a dielectric layer, a silicidable metal layer and an undoped filler material layer are used to create an anti-efuse device. The anti-efuse device may be situated in a dielectric layer of an interconnect structure for a semiconductor device or may be planar. Where part of an interconnect structure, the anti-efuse device may be realized by causing a current to flow therethrough while applying local heating. Where planar, the filler material may be situated between extensions of metal pads and metal atoms caused to move from the extensions to the filler material layer using a current flow and local heating.

8 Claims, 4 Drawing Sheets

(56) References Cited

U.S. PATENT DOCUMENTS

| | | | | |
|---|---|---|---|---|
| 5,576,576 A * | 11/1996 | Hawley | H01L 23/5252 | 257/209 |
| 5,602,053 A * | 2/1997 | Zheng | H01L 21/76807 | 257/355 |
| 5,708,291 A * | 1/1998 | Bohr | H01L 23/5256 | 257/529 |
| 5,714,795 A * | 2/1998 | Ohmi | H01L 23/5252 | 257/52 |
| 5,741,720 A * | 4/1998 | Hawley | H01L 23/5252 | 257/50 |
| 5,789,764 A * | 8/1998 | McCollum | H01L 23/5252 | 257/529 |
| 5,854,510 A * | 12/1998 | Sur, Jr. | H01L 23/5256 | 257/208 |
| 6,031,275 A * | 2/2000 | Kalnitsky | H01L 23/5252 | 257/530 |
| 6,051,851 A * | 4/2000 | Ohmi | G11C 17/16 | 257/185 |
| 6,111,302 A * | 8/2000 | Zhang | H01L 23/5252 | 257/530 |
| 6,141,245 A | 10/2000 | Bertin et al. | | |
| 6,208,549 B1 | 3/2001 | Rao et al. | | |
| 6,294,453 B1 * | 9/2001 | Marmillion | H01L 23/5256 | 257/529 |
| 6,337,507 B1 * | 1/2002 | Bohr | H01L 23/5256 | 257/529 |
| 6,384,666 B1 | 5/2002 | Bertin et al. | | |
| 6,815,797 B1 * | 11/2004 | Dark | H01L 23/5252 | 257/344 |
| 6,979,879 B1 * | 12/2005 | Yindeepol | H01L 29/866 | 257/529 |
| 7,268,577 B2 | 9/2007 | Erickson et al. | | |
| 7,287,177 B2 | 10/2007 | Bonaccio et al. | | |
| 7,576,407 B2 * | 8/2009 | Ko | H01L 23/5256 | 257/529 |
| 7,675,137 B2 * | 3/2010 | Kim | H01L 23/5256 | 257/529 |
| 7,872,898 B2 * | 1/2011 | Ching | G11C 17/16 | 257/392 |
| 7,968,967 B2 * | 6/2011 | Wang | H01L 23/5252 | 257/529 |
| 8,279,700 B2 * | 10/2012 | Wada | G11C 17/16 | 257/529 |
| 8,884,398 B2 * | 11/2014 | Lin | H01L 24/11 | 257/50 |
| 9,034,668 B2 * | 5/2015 | Mongillo | B82Y 10/00 | 438/17 |
| 2002/0168801 A1 * | 11/2002 | Johns | H01L 23/5252 | 438/131 |
| 2006/0145292 A1 * | 7/2006 | Park | H01L 23/5252 | 257/530 |
| 2007/0205485 A1 * | 9/2007 | Hsu | H01L 21/84 | 257/530 |
| 2008/0217736 A1 * | 9/2008 | Cestero | H01L 23/5252 | 257/530 |

OTHER PUBLICATIONS

Chiu, et al., "Copper silicide/silicon nanowire heterostructures: in situ TEM observation of growth behaviors and electron transport properties," Nanoscale, 2013, 5, 5086.

Kothandaraman, et al., "Electrically Programmable Fuse (eFUSE) Using Electromigration in Silicides," IEEE Electron Device Letters, vol. 23, No. 9, Sep. 2002, pp. 523-525.

Tonti, William R., "eFuse Design and Reliability," Integrated Reliability Workshop Final Report, 2008. IRW 2008. IEEE International Conference, Oct. 12-16, 2008, 3 pages.

Kalnitsky, et al., "CoSi2 integrated fuses on poly silicon for low voltage 0.18 μm CMOS applications," IEEE International Electron Devices Meeting (IEDM), 1999, pp. IEDM 99-765-99-768.

Tonti, et al., "Reliability and Design Qualification of a Sub-Micron Tungsten Silicide E-Fuse," IEEE 42nd Annual International Reliability Physics Symposium, Phoenix, 2004, pp. 152-156.

Fellner, et al., "Lifetime Study for a Poly Fuse in a 0.35 μm Polycide CMOS Process," IEEE 43rd Annual International Reliability Physics Symposium, San Jose, 2005, pp. 446-449.

Tonti, W. R., "eFuse Design and Reliability," IBM Microelectronics, Division Semiconductor Research & Development Center, Hopewell Junction, NY and Essex Junction, VT, 2008, 32 pages.

\* cited by examiner

SEMICONDUCTOR STRUCTURE WITH ANTI-EFUSE DEVICE

BACKGROUND OF THE INVENTION

Technical Field

The present invention generally relates to e-fuses. More particularly, the present invention relates to anti-efuses.

Background Information

Conventional options for semiconductor reverse (or anti-) efuses are limited. For example, phase change material/chalcogenides based efuse structures have been used to switch from zero to one. However, such efuses suffer from temperature based electrical instability. As another example, thin gate oxide has been used as an anti-efuse element, but it is not consistently reliable and needs relatively large voltage and power to program (or blow); after the conventional anti-efuse is blown into a short, it may revert back to a highly resistive state.

Thus, a need continues to exist for a reliable anti-efuse device.

SUMMARY OF THE INVENTION

The shortcomings of the prior art are overcome and additional advantages are provided through the provision, in one aspect, of a semiconductor structure. The structure includes a dielectric layer having a via therethrough, and an undoped filler material covering walls of the via and situated over a bottom of the via, silicided metal situated in at least one recess of the undoped filler material, no other metal being combined with the silicided metal, and a layer of silicided metal situated at a bottom of the via below the undoped filler material. The dielectric layer is part of an interconnect structure for a semiconductor device.

In accordance with another aspect, a method of transforming at least one silicidable metal layer into metal silicide is provided. The method includes providing an interconnect semiconductor structure, the interconnect semiconductor structure including a dielectric layer, and an anti-efuse structure within a via of the dielectric layer, the anti-efuse structure including a layer of undoped filler material, and at least one silicidable metal layer. The method further includes transforming the at least one silicidable metal layer into metal silicide.

In accordance with yet another aspect, a method of programming an anti-efuse device. The method includes providing a planar anti-efuse semiconductor structure, the anti-efuse semiconductor structure including a first metal pad with a first metal extension, a second metal pad opposite the first metal pad and having a second metal extension in a direction toward the first metal extension, and a layer of undoped filler material coupled between the first metal extension and the second metal extension. The method further includes transforming the layer of undoped filler material into metal silicide.

These, and other objects, features and advantages of this invention will become apparent from the following detailed description of the various aspects of the invention taken in conjunction with the accompanying drawings.

DETAILED DESCRIPTION OF THE INVENTION

Figure 1:
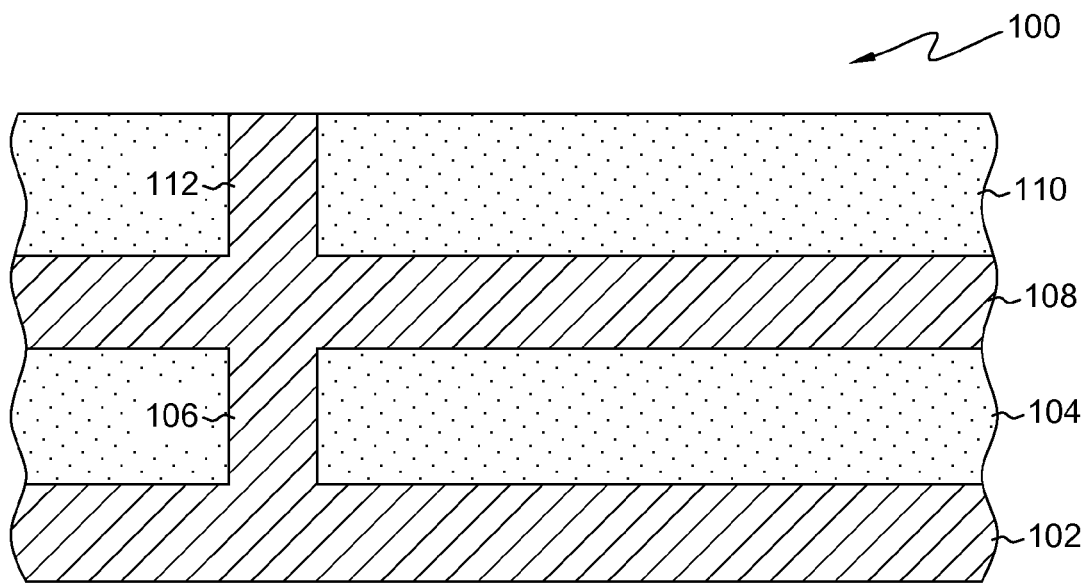
FIG. 1 is a cross-sectional view of one example of a starting interconnect structure for a semiconductor device (not shown), the starting structure comprising a first metal layer, a first dielectric layer with conductive via therein, a second metal layer, and a second dielectric layer with conductive via therein, in accordance with one or more aspects of the present invention.

Aspects of the present invention and certain features, advantages, and details thereof, are explained more fully below with reference to the non-limiting examples illustrated in the accompanying drawings. Descriptions of well-known materials, fabrication tools, processing techniques, etc., are omitted so as not to unnecessarily obscure the invention in detail. It should be understood, however, that the detailed description and the specific examples, while indicating aspects of the invention, are given by way of illustration only, and are not by way of limitation. Various substitutions, modifications, additions, and/or arrangements, within the spirit and/or scope of the underlying inventive concepts will be apparent to those skilled in the art from this disclosure.

Approximating language, as used herein throughout the specification and claims, may be applied to modify any quantitative representation that could permissibly vary without resulting in a change in the basic function to which it is related. Accordingly, a value modified by a term or terms, such as "about," is not limited to the precise value specified. In some instances, the approximating language may correspond to the precision of an instrument for measuring the value.

The terminology used herein is for the purpose of describing particular examples only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include (and any form of include, such as "includes" and "including"), and "contain" (and any form of contain, such as "contains" and "containing") are open-ended linking verbs. As a result, a method or device that "comprises," "has," "includes" or "contains" one or more steps or elements possesses those one or more steps or elements, but is not limited to possessing only those one or more steps or elements. Likewise, a step of a method or an element of a device that "comprises," "has," "includes" or "contains" one or more features possesses those one or more features, but is not limited to possessing only those one or more features. Furthermore, a device or structure that is configured in a certain way is configured in at least that way, but may also be configured in ways that are not listed.

As used herein, the term "connected," when used to refer to two physical elements, means a direct connection between the two physical elements. The term "coupled," however, can mean a direct connection or a connection through one or more intermediary elements.

As used herein, the terms "may" and "may be" indicate a possibility of an occurrence within a set of circumstances; a possession of a specified property, characteristic or function; and/or qualify another verb by expressing one or more of an ability, capability, or possibility associated with the qualified verb. Accordingly, usage of "may" and "may be" indicates that a modified term is apparently appropriate, capable, or suitable for an indicated capacity, function, or usage, while taking into account that in some circumstances the modified term may sometimes not be appropriate, capable or suitable. For example, in some circumstances, an event or capacity can be expected, while in other circumstances the event or capacity cannot occur—this distinction is captured by the terms "may" and "may be."

As used herein, unless otherwise specified, the term "about" used with a value, such as measurement, size, etc., means a possible variation of plus or minus three percent of the value. Also, unless otherwise specified, a given aspect of semiconductor fabrication described herein may be accomplished using conventional processes and techniques, where part of a method, and may include conventional materials appropriate for the circumstances, where a semiconductor structure is described.

Reference is made below to the drawings, which are not drawn to scale for ease of understanding, wherein the same reference numbers are used throughout different figures to designate the same or similar components.

FIG. 1 is a cross-sectional view of one example of a simplified starting interconnect structure 100 for real-world connections to the various parts of a semiconductor device (not shown), the starting structure comprising a first metal layer 102, a first dielectric layer 104 with conductive via 106 therein over the first metal layer, a second metal layer 108 over the first dielectric layer, and a second dielectric layer 110 with conductive via 112 therein over the second metal layer, in accordance with one or more aspects of the present invention.

The starting structure may be conventionally fabricated, for example, using known processes and techniques. Further, unless noted otherwise, conventional processes and techniques may be used to achieve individual steps of the fabrication process of the present invention. However, although only a portion is shown for simplicity, it will be understood that, in practice, such structures span a number of semiconductor devices.

Figure 2:
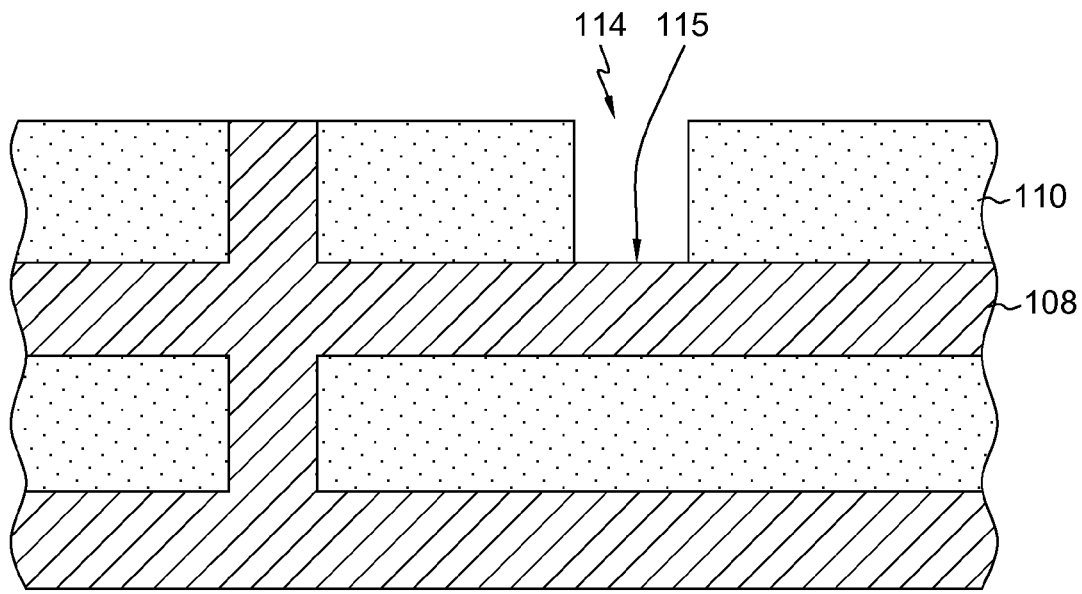
FIG. 2 depicts one example of the starting structure of FIG. 1 after creating a via in the second dielectric layer, in accordance with one or more aspects of the present invention.

FIG. 2 depicts one example of the starting structure 100 of FIG. 1 after selectively forming a via 114 (for an anti-efuse device) in the second dielectric layer 110 using, for example, lithography, masking and etching processes, exposing a surface 115 of second metal layer 108, in accordance with one or more aspects of the present invention.

Figure 3:
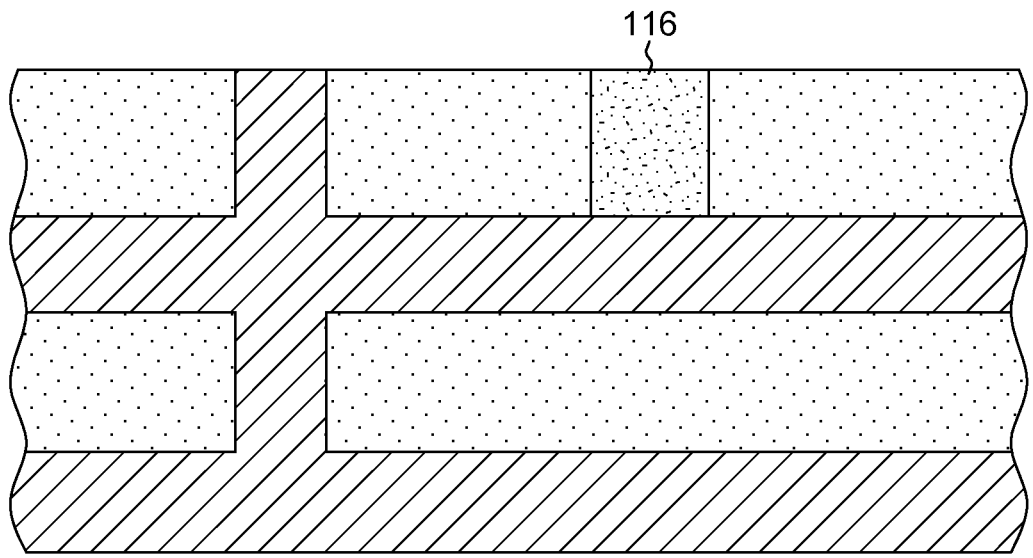
FIG. 3 depicts one example of the structure of FIG. 2 after filling the via with undoped filler material and planarizing, in accordance with one or more aspects of the present invention.

FIG. 3 depicts one example of the structure of FIG. 2 after filling the via (114, FIG. 2) with undoped filler material 116 (e.g., amorphous silicon or polysilicon) and planarizing, using, for example, a chemical-mechanical polishing (CMP) process, in accordance with one or more aspects of the present invention.

Figure 4:
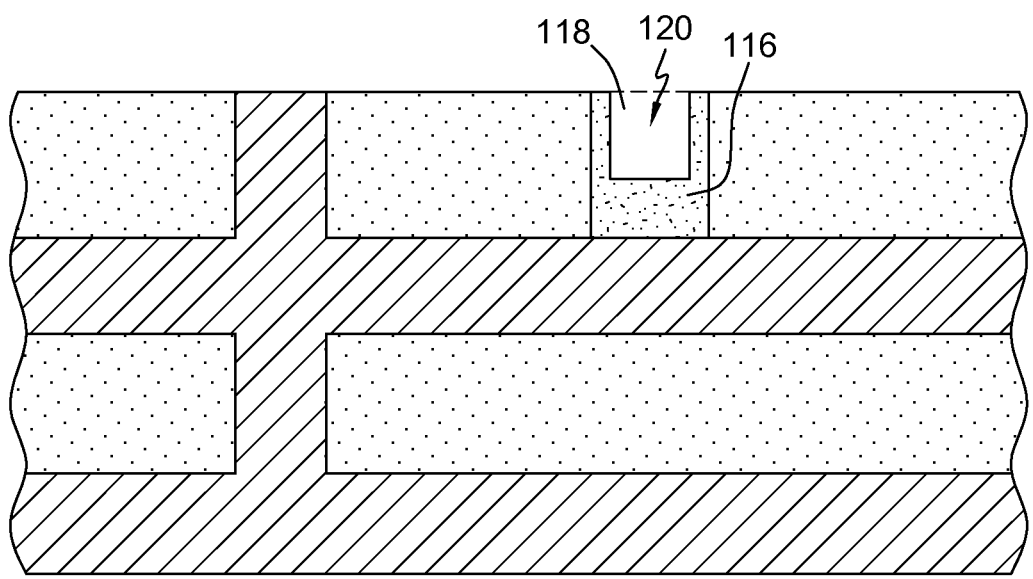
FIG. 4 depicts one example of the structure of FIG. 3 after a top center portion of the undoped filler material is removed and forming an opening, in accordance with one or more aspects of the present invention.

FIG. 4 depicts one example of the structure of FIG. 3 after a top center portion 118 of the undoped filler material 116 is partially removed (e.g., by anisotropic silicon Reactive Ion Etching (RIE), an opening 120 is formed, in accordance with one or more aspects of the present invention. Some of the filler material may optionally be left on the sidewalls with no impact on the operation of the anti-efuse, for example, when a liner will not be included.

Figure 5:
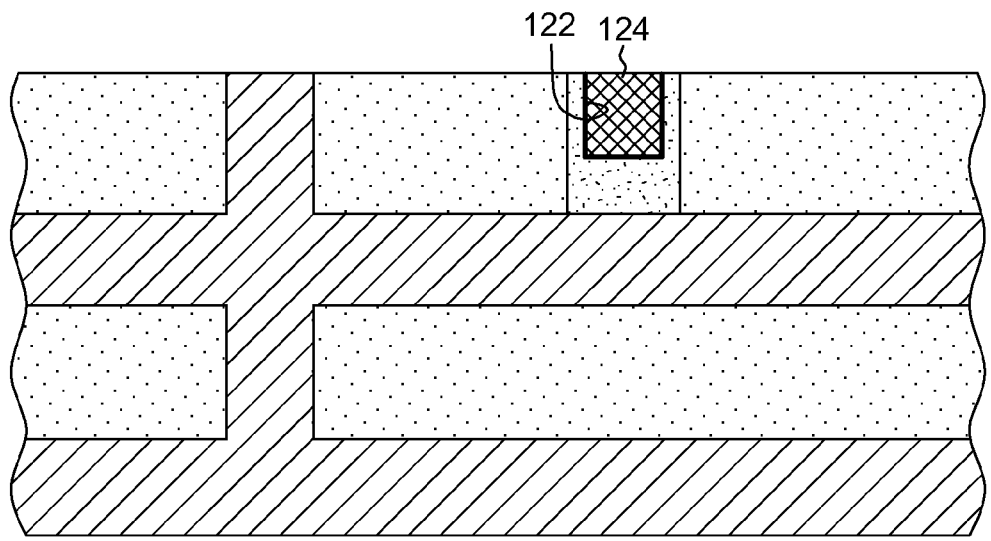
FIG. 5 depicts one example of the structure of FIG. 4 after forming an optional liner and filling the opening with a silicidable metal and planarizing, in accordance with one or more aspects of the present invention.

FIG. 5 depicts one example of the structure of FIG. 4 after forming an optional liner 122 on filler-material-free surfaces of the opening, and filling the opening (120, FIG. 4) with a silicidable metal 124 and planarizing, in accordance with one or more aspects of the present invention. The liner is to serve the purpose of better adherence between the silicidable metal 124 and the filler material or dielectric 110 (if no filler material remains on the sidewalls).

In one example, the liner may include, for example, tantalum or tantalum nitride, and may be created using conventional processes and techniques.

Figure 6:
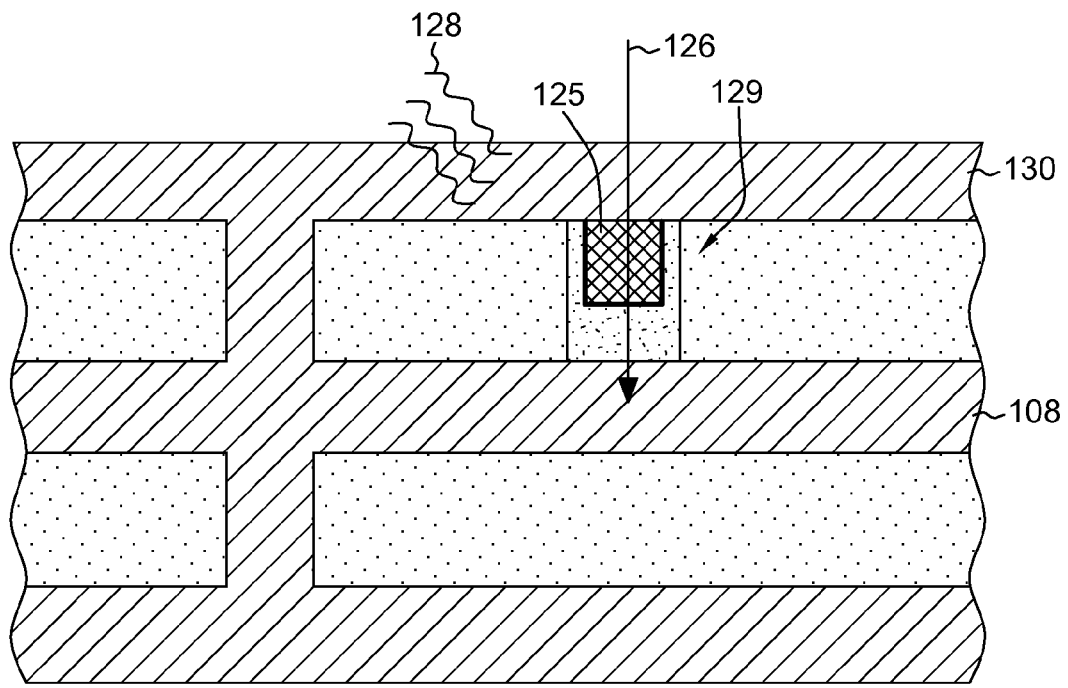
FIG. 6 depicts one example of the structure of FIG. 5 after formation of a third metal layer and during programming of the anti-efuse device, for example, creating silicide from the silicidable metal by forcing current through the anti-efuse device between the second and third metal layers while applying localized heat to the silicidable metal, in accordance with one or more aspects of the present invention.

FIG. 6 depicts one example of the structure of FIG. 5 after formation of a third metal layer 130 and during programming of anti-efuse device 129, for example, creating silicide 125 from the silicidable metal (124, FIG. 5) by forcing current 126 through metal layer 130 and the anti-efuse device to metal layer 108, while applying localized heat 128 to the silicidable metal (124, FIG. 5), in accordance with one or more aspects of the present invention.

Figure 7:
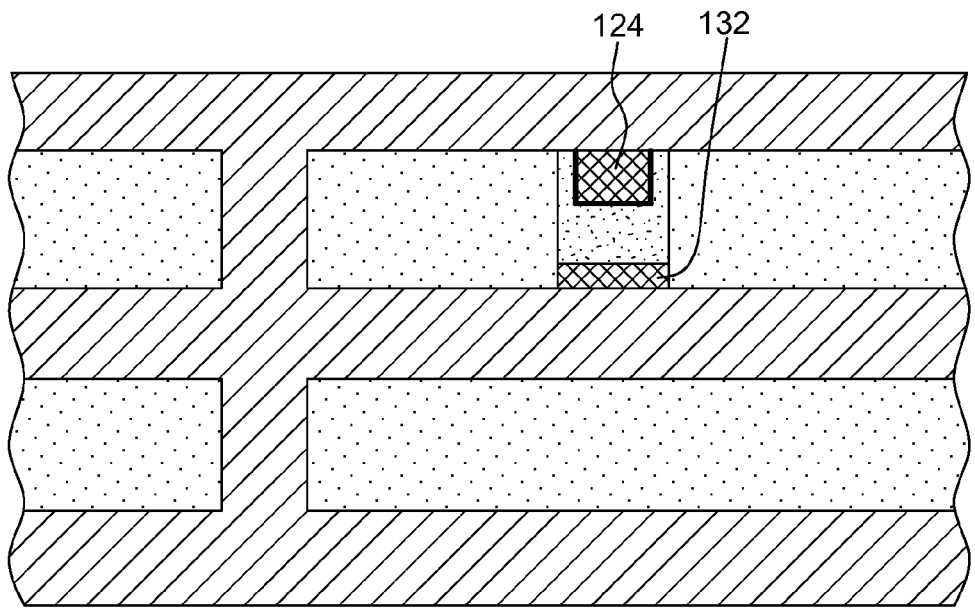
FIG. 7 depicts one example of a variation to the anti-efuse structure of FIG. 6; in this case, including a bottom layer of the silicidable metal, in accordance with one or more aspects of the present invention.

FIG. 7 depicts one example of a variation to the anti-efuse structure of FIG. 6; in this case, including a bottom layer 132 of the silicidable metal 124 while reducing the size of the upper metal, in accordance with one or more aspects of the present invention. Note that the silicidable metal 132 and 124 can include different metal, for example, any of copper, tungsten, nickel, aluminum and cobalt.

Figure 8:
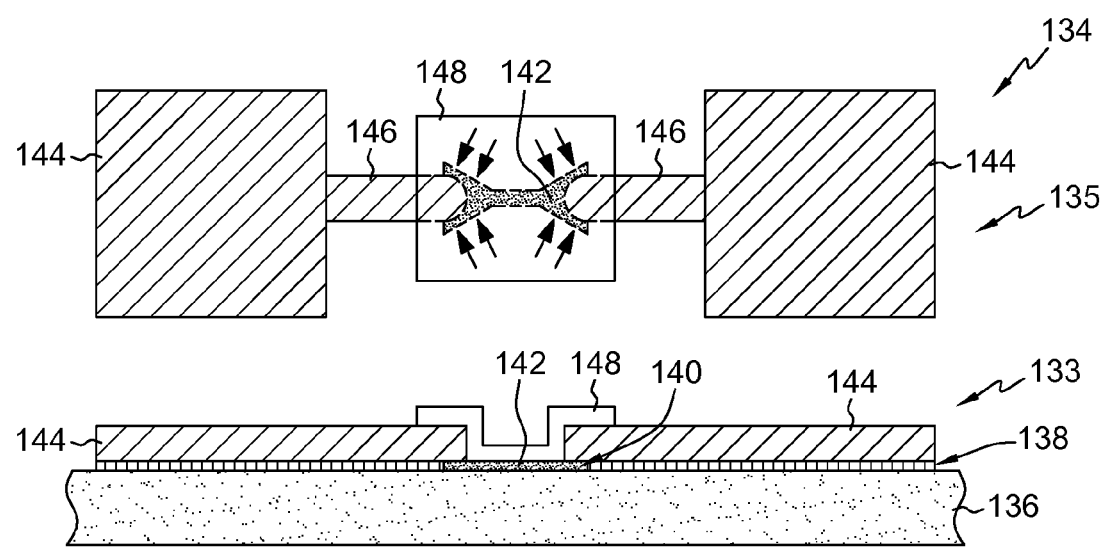
FIG. 8 depicts one example of a planar anti-efuse showing a cross-sectional view and a top-down view, the planar anti-efuse including a bottom dielectric layer, a liner layer over the bottom dielectric layer, the liner layer having an area in a middle portion thereof, the area including an undoped filler material, a copper layer above the liner layer, with extensions contacting the area of undoped filler material, and an optional cap over the common areas of the filler material and ends of the extensions, in accordance with one or more aspects of the present invention.

FIG. 8 depicts one example of a planar anti-efuse structure 134 showing a cross-sectional view 133 and a top-down view 135, the planar anti-efuse structure including a bottom dielectric layer 136, a liner layer 138 over the bottom dielectric layer, the liner layer having an area 140 in a middle portion thereof that includes an undoped filler material 142, a copper layer 144 above the liner layer, with extensions 146 contacting the area of undoped filler material, and an optional cap 148 over the common areas of the filler material and ends of the extensions, in accordance with one or more aspects of the present invention.

In a first aspect, disclosed above is a semiconductor structure. The structure includes a dielectric layer, a metal layer, and a filler material layer in electrical contact with the metal layer that is capable of being transformed into metal silicide.

In one example, the dielectric layer may be, for example, part of an interconnect structure for a semiconductor device and may include, for example, a via, the filler material layer being situated over walls and a bottom of the via, and the metal layer being situated over the filler material layer.

In one example, the interconnect structure may further include, for example, a second layer of the metal between the filler material layer and the bottom of the via. In another example, the interconnect structure may further include, for example, a liner between the metal layer and the filler material layer. In one example, the liner may include, for example, one of tantalum and tantalum nitride.

In one example, where the interconnect structure is used, the metal layer may include, for example, one of copper, nickel, cobalt, aluminum, and tungsten.

In one example, where the interconnect structure is used, the filler material layer may include, for example, one of amorphous silicon, polycrystalline silicon, silicon germanium and germanium.

In one example, the metal layer in the semiconductor structure of the first aspect may include, for example, at least two metal pads, each metal pad having a metal extension in a direction of the other metal pad, and the filler material layer joins the metal extensions.

In one example, the semiconductor structure may further include, for example, a liner between the metal pads and extensions.

In one example, the semiconductor structure may further include, for example, a cap over the filler material layer and end portions of the metal extensions in contact with the filler material layer. In one example, the cap may include, for example, one of silicon nitride and silicon dioxide.

In one example, the metal pads and metal extensions may include, for example, one of copper, nickel, cobalt, aluminum, gold and silver.

In one example, the filler material may include, for example, one of amorphous silicon, polycrystalline silicon, silicon germanium and germanium.

In one example, the liner may include, for example, one of tantalum and tantalum nitride.

In a second aspect, disclosed above is a method. The method includes providing an interconnect semiconductor structure, the interconnect semiconductor structure including a dielectric layer, and an anti-efuse structure within a via of the dielectric layer, the anti-efuse structure including a layer of undoped filler material, and silicidable metal layer(s). The method further includes transforming the silicidable metal layer(s) into metal silicide.

In one example, the transforming may include, for example, causing a current to flow through the anti-efuse structure while applying local heating, and stopping the current and the local heating when the silicidable metal becomes conductive.

In one example, the interconnect semiconductor structure provided further comprises a first metal layer above the dielectric layer and a second metal layer below the dielectric layer. In one example, after the transforming, the anti-efuse structure may provide, for example, an electrical connection between the first and second metal layers of the interconnect semiconductor structure.

In a third aspect, disclosed above is a method. The method includes providing a planar anti-efuse semiconductor structure, the anti-efuse semiconductor structure including a first metal pad with a first metal extension, a second metal pad opposite the first metal pad and having a second metal extension in a direction toward the first metal extension, and a layer of undoped filler material coupled between the first metal extension and the second metal extension. The method further includes transforming the layer of undoped filler material into metal silicide.

In one example, the transforming includes causing the metal atoms to move to the layer of undoped filler material layer, which may be accomplished by, for example, causing a current to flow through the filler material layer while applying local heating, and stopping the current and the local heating when the filler material with metal atoms becomes conductive.

While several aspects of the present invention have been described and depicted herein, alternative aspects may be effected by those skilled in the art to accomplish the same objectives. Accordingly, it is intended by the appended claims to cover all such alternative aspects as fall within the true spirit and scope of the invention.

The invention claimed is:

1. A semiconductor structure, comprising:
   a dielectric layer having a via therethrough;
   an undoped filler material covering walls of the via and situated over a bottom of the via;
   silicided metal situated in at least one recess of the undoped filler material, wherein no other metal is combined with the silicided metal;
   a layer of silicided metal situated at a bottom of the via below the undoped filler material; and
   wherein the dielectric layer is part of an interconnect structure for a semiconductor device.

2. The semiconductor structure of claim 1, further comprising:
   a first layer of metal underlying the dielectric layer and the via, wherein the first layer of metal is separate from the silicided metal; and
   a second layer of metal covering the dielectric layer and the via, wherein the second layer of metal is separate from the silicided metal.

3. The semiconductor structure of claim 1, further comprising a liner between the silicided metal and the undoped filler material.

4. The semiconductor structure of claim 3, wherein the liner comprises one of tantalum and tantalum nitride.

5. The semiconductor structure of claim 1, wherein the silicided metal comprises one of copper, nickel, cobalt, aluminum and tungsten.

6. The semiconductor structure of claim 1, wherein the undoped filler material comprises one of amorphous silicon, polycrystalline silicon and germanium.

7. The semiconductor structure of claim 1, wherein the silicided metal situated in the at least one recess and the silicided metal situated at the bottom of the via each comprise a different metal.

8. The semiconductor structure of claim 7, wherein the silicided metal situated in the at least one recess and the silicided metal situated at the bottom of the via each comprise a different one of copper, tungsten, nickel, aluminum and cobalt.

* * * * *

UNITED STATES PATENT AND TRADEMARK OFFICE
CERTIFICATE OF CORRECTION

PATENT NO. : 9,754,903 B2
APPLICATION NO. : 14/926880
DATED : September 5, 2017
INVENTOR(S) : Patil et al.

It is certified that error appears in the above-identified patent and that said Letters Patent is hereby corrected as shown below:

On the Title Page

In the Assignee (73): Delete "Grang Cayman (KY)" and insert -- Grand Cayman (KY) --

Signed and Sealed this
Twenty-fourth Day of October, 2017

Joseph Matal
*Performing the Functions and Duties of the*
*Under Secretary of Commerce for Intellectual Property and*
*Director of the United States Patent and Trademark Office*